United States Patent
Tihanyi

[19]

[11] Patent Number: 5,923,066
[45] Date of Patent: Jul. 13, 1999

[54] FIELD-EFFECT-CONTROLLABLE SEMICONDUCTOR COMPONENT

[75] Inventor: Jenoe Tihanyi, Kirchheim, Germany

[73] Assignee: Siemens Aktiengesellschaft, Munich, Germany

[21] Appl. No.: 08/940,473

[22] Filed: Sep. 30, 1997

[30] Foreign Application Priority Data

Sep. 30, 1996 [DE] Germany .......................... 196 40 307

[51] Int. Cl.⁶ ............................. H01L 29/78; H01L 29/87
[52] U.S. Cl. .......................... 257/331; 257/342; 257/139; 257/147; 257/172
[58] Field of Search .................................... 257/266, 341, 257/342, 403, 331, 172, 147, 139

[56] References Cited

U.S. PATENT DOCUMENTS 4,791,462  12/1988  Blanchard ............................... 257/266
5,321,289   6/1994  Baba ....................................... 257/331

OTHER PUBLICATIONS

Syau et al *IEEE Trans on Elec. Dev.* vol. 41 No. 5 Comparison . . . UMOSFET's pp. 800–807, May 1994.

*Primary Examiner*—Jerome Jackson, Jr.
*Attorney, Agent, or Firm*—Herbert L. Lerner; Laurence A. Greenberg

[57] ABSTRACT

A field-effect-controllable semiconductor component includes a semiconductor body with first and second surfaces. An inner zone of a first conduction type adjoins the first surface. An anode zone of the opposite, second conduction type adjoins the inner zone in the direction of the first surface and adjoins the second surface in the opposite direction. At least one first base zone of the second conduction type is embedded in the first surface. At least one source zone of the first conduction type is embedded in the first surface. At least one source electrode makes contact with the base zones and the source zones. At least one gate electrode is insulated from the semiconductor body and the source electrode by a gate oxide and at least partly covers parts of the first base zones appearing at the first surface. Intermediate cell zones contain the source zones. Trenches enclose the intermediate cell zones and are insulated from the intermediate cell zones by a gate oxide. Gate electrode pins in the trenches are connected to the gate electrode running on the first surface.

14 Claims, 3 Drawing Sheets

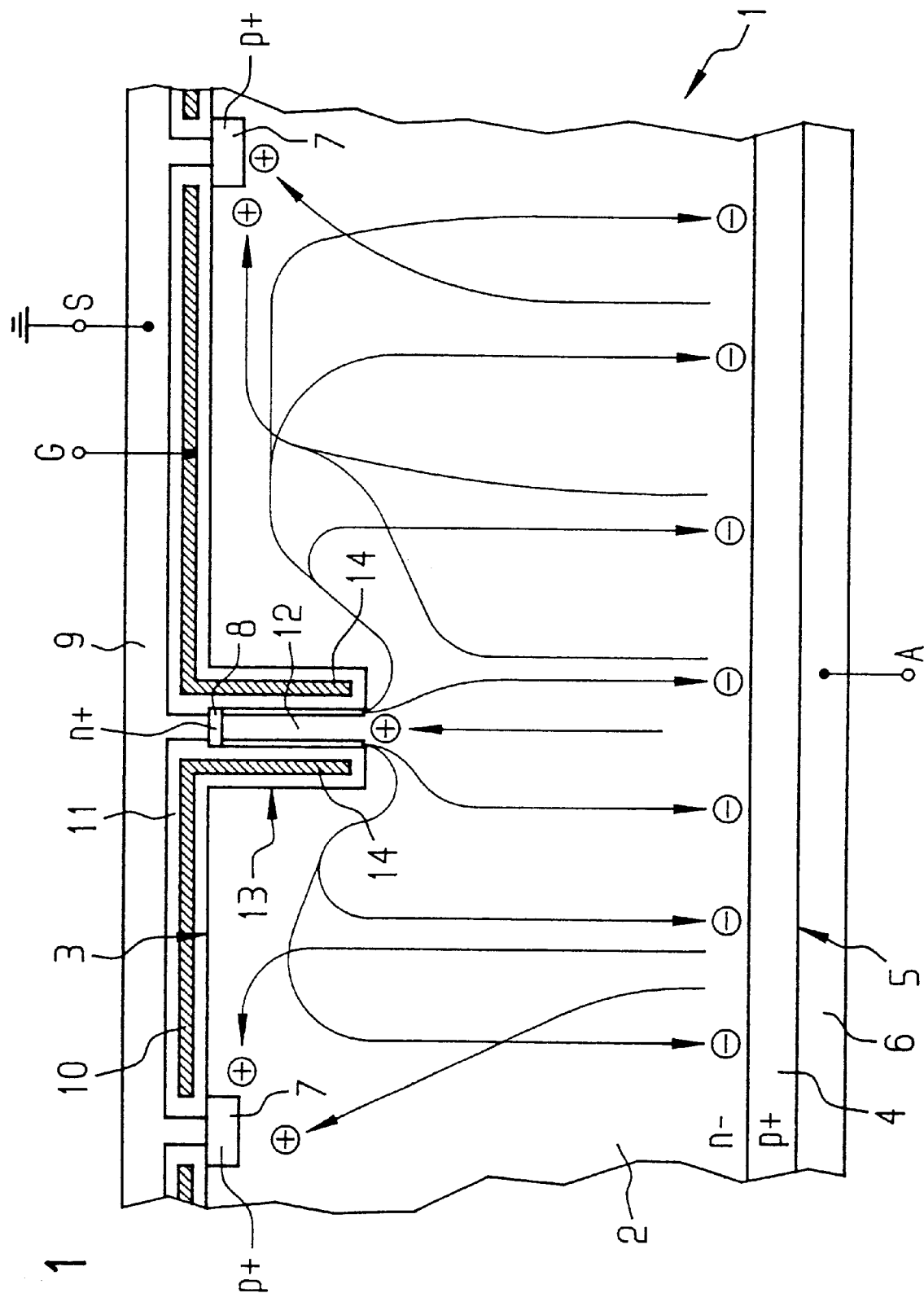

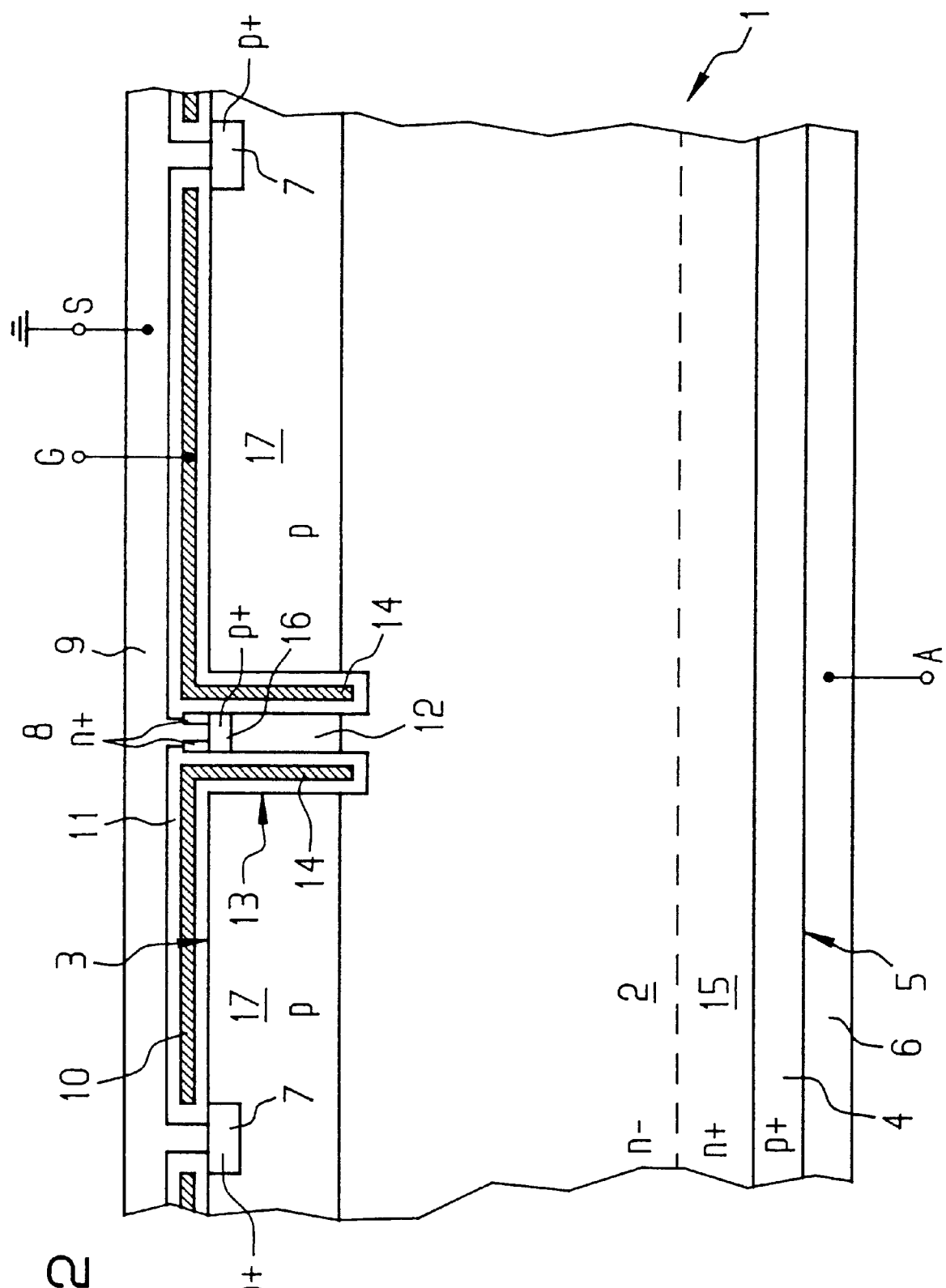

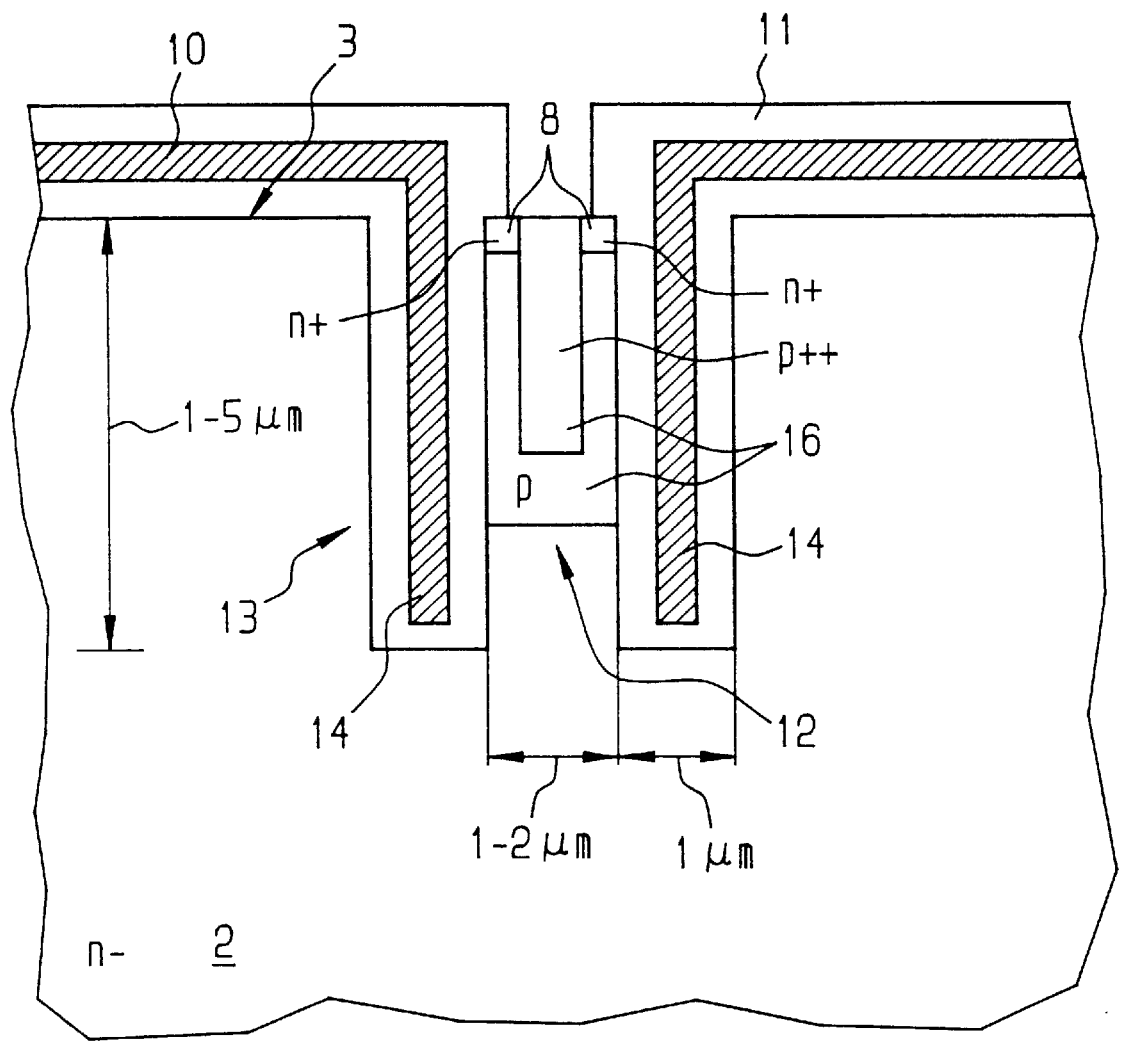

FIELD-EFFECT-CONTROLLABLE SEMICONDUCTOR COMPONENT

BACKGROUND OF THE INVENTION

1. Field of the Invention

The invention relates to a field-effect-controllable semiconductor component, including a semiconductor body with the following features:
a) an inner zone of a first conductivity type, which adjoins a first surface of the semiconductor body,
b) an anode zone of an opposite, second conductivity type, which adjoins the inner zone in the direction of the first surface and which adjoins the second surface in an opposite direction,
c) at least one first base zone of the second conductivity type, which is embedded in the first surface in the semiconductor body,
d) at least one source zone of the first conductivity type, which is embedded in the first surface in the semiconductor body,
e) at least one source electrode, which makes contact with the base zones and the source zones, and
f) at least one gate electrode, which is insulated from the semiconductor body and the source electrode by a gate oxide and which at least partly covers parts of the first base zones appearing at the first surface.

A semiconductor component of the above-described type is known as an IGBT (Isolated Gate Bipolar Transistor) and is described, for example, in the journal "Electronik" [Electronics] 9, 1987, pages 120 to 124.

Furthermore, IGBTs with trench structures derived from DRAM technology are known. The difference between those IGBTs and the IGBTs mentioned above resides in the fact that the gate electrode is produced as a V-shaped or U-shaped trench through the use of anisotropic etching (etching in the direction of the crystal grating), in such a way that the gate electrode made of doped polysilicon or metal is disposed in an insulated manner on silicon dioxide. Very low surface resistances and high packing densities are achieved in that way. The nonplanar configuration of the structure and the sharp deviation from the production technology used in integrated circuits is also disadvantageous. On the other hand, as is known, the respective turn-on resistance $R_{ON}$ and forward voltage $V_{SAT}$ of an IGBT in trench technology can be reduced with respect to the IGBTs mentioned at the outset, as a result of the fact that parasitic JFETs, which exist between the cells of planar transistor structures, are in principle dispensed with.

Advantageously, in the case of IGBTs, the inlet point of the electrons and the holes are physically separated. That can be achieved, for example in SOI technology (Silicon-On-Insulator), through the use of a buried silicon dioxide layer.

SUMMARY OF THE INVENTION

It is accordingly an object of the invention to provide a field-effect-controllable semiconductor component, which overcomes the hereinafore-mentioned disadvantages of the heretofore-known devices of this general type having a trench structure, in particular an IGBT, in such a way that the latter has a low turn-on resistance $R_{ON}$ with equally good blocking properties. In addition, the semiconductor component is to achieve the parameters of an IGBT with an SOI structure, without the indicated disadvantages of an SOI structure having to be accepted.

With the foregoing and other objects in view there is provided, in accordance with the invention, a field-effect-controllable semiconductor component, comprising a semiconductor body having: a first surface and a second surface; an inner zone of a first conductivity type adjoining the first surface; an anode zone of a second conductivity type opposite the first conductivity type, the anode zone adjoining the inner zone in a direction toward the first surface and adjoining the second surface in an opposite direction; at least one first base zone of the second conductivity type embedded in the first surface and having parts appearing at the first surface; at least one intermediate cell zone; at least one source zone of the first conductivity type disposed in the at least one intermediate cell zone and embedded in the first surface; at least one source electrode making contact with the at least one base zone and the at least one source zone; at least one gate electrode extended on the first surface and at least partly covering the parts of the at least one base zone; a gate oxide insulating the at least one gate electrode from the semiconductor body and the at least one source electrode; at least one trench enclosing the at least one intermediate cell zone and insulated from the at least one intermediate cell zone by the gate oxide; and gate electrode pins disposed in the at least one trench and connected to the at least one gate electrode.

It is advantageous if an IGBT has a small voltage drop when switched on. To this end, the "flooding" of the anode zone must be as high as possible. On one hand, this can be achieved if the area of the $p^+$ base zones, which are at the 0V potential, is as small as possible. On the other hand, it is advantageous if the inlet point of the electrons and the outlet point of the holes are physically separated. To this end, the invention relates to an IGBT having trench structures and operating like an SOI.

In accordance with another feature of the invention, the trenches have the form of pins which project vertically into the semiconductor body. These pin structures may be implemented by using the conventional trench technology from DRAM technology, with the advantages of the easily convertible planar technologies, such as DMOS technology or SIPMOS technology, being maintained.

In accordance with a further feature of the invention, the gate electrodes are typically composed of doped polysilicon, because the production is simple in terms of process technology. However, other materials are also conceivable for the gate electrodes, such as metal or metal silicide. The gate electrodes are insulated with respect to the semiconductor body through a gate oxide. Thermal silicon dioxide is preferably used as the gate oxide since it is easy to handle in terms of process technology and has good quality. The gate electrode pins in the trenches do not necessarily have to cohere with the lateral gate electrodes at the front side of the wafer. They may also be of circular ring-shaped construction and connected to the gate connection through an electrical contact.

In accordance with an added feature of the invention, the intermediate cell zones are constructed to be strip-shaped or circular ring-shaped in the plane of the wafer surface. However, the intermediate cell zones may also have a prism-shaped or cylindrical cross section.

In accordance with an additional feature of the invention, there are provided second base zones contained in the intermediate cell zones. Some of these second base zones advantageously have a pin-like shape and project vertically from the wafer surface into the intermediate cell zones. The pin-shaped regions of the second base zone have a very high doping concentration. As a result, on one hand the threshold voltage is set by p-outward diffusion in the intermediate cell zone. On the other hand, the inlet point of the electrons and the outlet point of the holes are physically separated.

In accordance with yet another feature of the invention, there is provided a highly-doped buffer zone on the anode side. This makes it possible for the IGBT structure to be produced in the Punch Through version, in addition to the known Non-Punch-Through version. The buffer zone has the task of preventing the electrical field from reaching through at full reverse voltage, and of reducing the powerful injection effect of the base.

In accordance with yet a further feature of the invention, there is provided a floating layer in the vicinity of the wafer surface. When high reverse voltages are present, critical field strength peaks at the trench edges can be avoided through the use of the floating layer, without the favorable charge-carrier distribution being impaired in the switched-on state. The breakdown of the semiconductor element is thus shifted to higher voltage.

In accordance with yet an added feature of the invention, the at least one intermediate cell zone has a width laterally of 1 to 2 µm.

In accordance with yet an additional feature of the invention, the at least one trench projects approximately 1 to 5 µm from the first surface into the semiconductor body.

In accordance with again another feature of the invention, the at least one trench has a width laterally of approximately 1 µm.

In accordance with a concomitant feature of the invention, the at least one trench is spaced from the at least one base zone by 5 to 20 µm.

Other features which are considered as characteristic for the invention are set forth in the appended claims.

Although the invention is illustrated and described herein as embodied in a field-effect-controllable semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view of a semiconductor component according to the invention having trench structures;

FIG. 2 is a fragmentary, sectional view of a semiconductor component according to the invention having trench structures and additionally having a buffer zone in the vicinity of a rear side of a wafer, a floating layer in the vicinity of a front side of the wafer and further base zones in intermediate cell zones; and FIG. 3 is an enlarged, fragmentary, sectional view showing an advantageous embodiment of second base zones in the intermediate cell zones.

DESCRIPTION OF THE PREFERRED EMBODIMENTS

Referring now to the figures of the drawings in detail and first, particularly, to FIG. 1 thereof, there is seen a general embodiment of a semiconductor component according to the invention having trench structures. In particular, the semiconductor component is an IGBT.

A semiconductor body 1, for example a silicon wafer, is $n^-$-doped. The untreated, $n^-$-doped semiconductor body 1 is referred to below as an inner zone 2. A $p^+$-doped anode zone 4 has been made at a rear wafer side 5 of the $n^-$-doped inner zone 2, for example by ion implantation. Contact is made over a large area with the anode zone 4 on the rear side 5 of the wafer through normal metallizing. This metallizing forms an anode electrode 6, which is connected to an anode connection A.

It is seen that $p^+$-doped base zones 7 are embedded in the inner zone 2 at a front side 3 of the wafer, for example by ion implantation or diffusion. In addition, gate electrodes 10, which are insulated with respect to the semiconductor body 1 by a gate oxide 11, are provided on the front side 3 of the wafer. Thermally oxidized silicon dioxide is preferably used as the gate oxide 11, since it is easy to handle in process technology terms and for reasons of quality. The gate electrodes 10 are disposed laterally over the front side 3 of the wafer in such a way that they cover regions at which the inner zone 2 adjoins the wafer surface. Contact holes, through which contact may be made with the base zones 7 through the use of normal metallizing, are located in the region of the base zones 7. This metallizing forms a source electrode 9, which is connected to a source connection S.

In addition, trench-shaped regions are provided on the front side 3 of the wafer. These regions, which are referred to below as trenches 13, contain gate electrode regions that are connected to the lateral gate electrodes 10 at the wafer surface. In addition, in the region of the trenches 13, the gate electrodes 10 are insulated with respect to the inner zone 2 through the use of the gate oxide 11. The gate electrodes 10 in the region of the trenches are in the form of pins projecting vertically into the semiconductor body 1, and are referred to below as gate electrode pins 14. In each case, two adjacent trenches 13 are separated by an intermediate cell zone 12. The intermediate cell zones 12 have a column-like cross section, in the vertical direction. The intermediate cell zones 12 contain source zones 8. The source zones 8 are $n^+$-doped and adjoin the surface of the front side 3 of the wafer. There are likewise contact holes at the front side 3 of the wafer, in the region of the source zones 8. Contact is made through these contact holes between the source zones 8 and the source electrode 9.

As mentioned above, the intermediate cell zones 12 are of column-like construction. The intermediate cell zones 12 may be constructed to be strip-shaped, serpentine or circular ring-shaped in the plane of the wafer surface. However, it is also conceivable for the intermediate cell zones 12 to have an irregular, elliptical or rectangular cross section in the plane of the wafer surface 3.

The mode of operation of the IGBT structure according to FIG. 1 will be described below. In this case, an electron current is illustrated by arrows from the front side 3 of the wafer toward the anode connection A at the rear side 5 of the wafer. A hole current is illustrated by arrows in the opposite direction toward the source connection S at the front side 3 of the wafer.

If a positive gate voltage is applied to the gate electrodes 10, 14, a current channel forms at a surface of the column-like intermediate zones 12, which adjoin the gate oxide 11. This current channel may be modulated by the gate voltage. The electrons flow out of the column of the intermediate cell zone 12, distribute themselves over the entire area of the inner zone 2 and then flow uniformly toward the anode connection. For the most part, the holes flow into the p$^+$-doped base zones 7. The result is uniformly high "flooding through" in the n$^-$-doped inner zone, which signifies a reduced turn-on resistance R$_{ON}$.

FIG. 2 shows a further advantageous refinement of the IGBT according to the invention and according to FIG. 1. Identical elements are provided with identical reference symbols in both figures. The IGBT shown in FIG. 2 is a development of the IGBT shown in FIG. 1.

On the anode side, the inner zone 2 receives a thin n$^+$-doped layer. This layer will be referred to below as a buffer zone 15. This makes it possible to represent the IGBT structure in the known Non-Punch-Through version (NPT version) corresponding to FIG. 1, and in the Punch-Through version (PT version). The buffer zone has the task of preventing the electrical field from reaching through to the base zone at full reverse voltage, and of reducing the powerful injection action of the base.

In addition, second base zones 16 are provided in the intermediate cell zones 12. These second base zones 16 are p$^+$-doped and adjoin the source zones 8. In addition, contact is also made between the second base zones 16 and the source electrode 9.

Furthermore, a p-doped region 17 is provided in FIG. 2. This p-doped region 17 adjoins the n$^-$-doped inner zone 2 on the anode side and adjoins the respective wafer surface and the base zones 7, 16 on the source side. In particular, the p-doped region 17 forms a floating zone between the trench regions which reduces the field strength, even at higher voltage, and therefore prevents premature breakdown.

FIG. 3 shows an advantageous refinement of the second base zone 16. Elements identical to those in FIG. 2 are provided with identical reference symbols in FIG. 3.

Some of the second base zones 16 in the intermediate cell zones 12 are of pin-shaped construction. These pin-shaped regions of the second base zones 16 are typically p$^{++}$-doped, and respectively project vertically from the source zone 8 as well as the source electrode 9, into the semiconductor body 1. Remaining regions of the second base zone 16 are p-doped. The doping of this zone may be carried out by p-outward diffusion from the p$^{++}$-doped base region. On one hand, this p-outward diffusion makes it possible to set the threshold voltage exactly in the p-doped regions of the second base zone 16. On the other hand, an inlet point of the electrons and an outlet point of the holes can be physically separated as a result of the pin-shaped second base zone 16.

Typical dimensions and spacings are also indicated in FIG. 3. The trenches 13 have a spacing from one another of typically 1 to 2 $\mu$m. The width of the trenches 13 in this case is about 1 $\mu$m. The trenches 13, projecting vertically in a trench shape into the semiconductor body 1, typically have a central depth of 1 to 5 $\mu$m. The spacing of the trenches 13 from the base zones 7 is on average 5 to 20 $\mu$m, although not illustrated in FIG. 3.

The gate electrode pins 14 in the trenches 13 do not necessarily have to cohere with the lateral gate electrodes 10 at the front side 3 of the wafer. They may also be of circular ring-shaped construction and be connected to a gate connection G through an electrical contact.

The IGBTs according to the invention are advantageously implemented by using npn MOSFETs corresponding to FIGS. 1 and 2. These IGBTs may be controlled or blocked simply. It is also conceivable to implement the IGBTs by using pnp MOSFETS. However, such IGBTs are difficult to turn off.

The requirements on the oxide layer, which surrounds both the pin-shaped gate electrodes and the lateral gate electrodes, are not as high as in comparison with the chemical or electrodynamic requirements on the gate oxide 11. It is accordingly also conceivable to employ spin-on-glass or other chemical processes in this case, which result in relatively loosely packed oxide layers of low density and accordingly lower dielectric constant.

I claim:

1. A field-effect-controllable semiconductor component, comprising:
    a semiconductor body having:
        a) a first surface and a second surface;
        b) an inner zone of a first conductivity type adjoining said first surface;
        c) an anode zone of a second conductivity type opposite the first conductivity type, said anode zone adjoining said inner zone in a direction toward said first surface and adjoining said second surface in an opposite direction;
        d) at least one base zone of the second conductivity type embedded in said first surface and having parts appearing at said first surface;
        e) at least one intermediate cell zone;
        f) at least one source zone of the first conductivity type disposed in said at least one intermediate cell zone and embedded in said first surface;
        g) at least one source electrode making contact with said at least one base zone and said at least one source zone;
        h) at least one gate electrode extended on said first surface and at least partly covering said parts of said at least one base zone;
        i) a gate oxide insulating said at least one gate electrode from said semiconductor body and said at least one source electrode;
        j) at least one trench enclosing said at least one intermediate cell zone and insulated from said at least one intermediate cell zone by said gate oxide; and
        k) gate electrode pins disposed in said at least one trench and connected to said at least one gate electrode.

2. The field-effect-controllable semiconductor component according to claim 1, wherein said at least one trench is pin-shaped and projects vertically from said first surface into said semiconductor body.

3. The field-effect-controllable semiconductor component according to claim 1, wherein said at least one gate electrode and said gate electrode pins are at least partly formed of a material selected from the group consisting of doped polysilicon, metal and metal silicide.

4. The field-effect-controllable semiconductor component according to claim 1, wherein said gate oxide is silicon dioxide.

5. The field-effect-controllable semiconductor component according to claim 1, wherein said at least one intermediate cell zone has a shape selected from the group consisting of strip-shaped, serpentine and circular ring-shaped in a plane of said first surface.

6. The field-effect-controllable semiconductor component according to claim 1, wherein said at least one intermediate cell zone has a shape selected from the group consisting of prism-shaped and cylindrical in a plane of said first surface.

7. The field-effect-controllable semiconductor component according to claim 1, including other base zones of the second conductivity type disposed in said at least one intermediate cell zone and adjoining said first surface.

8. The field-effect-controllable semiconductor component according to claim 7, wherein at least some of said other base zones disposed in said at least one intermediate cell zone have pin-shaped regions projecting vertically from said first surface into said at least one intermediate cell zone.

9. The field-effect-controllable semiconductor component according to claim 1, including a buffer zone disposed in said inner zone on the anode side and having the same conductivity type as said inner zone, said buffer zone having a doping concentration at least a factor of 10 greater than a doping concentration of said inner zone.

10. The field-effect-controllable semiconductor component according to claim 1, including a floating layer disposed between said first surface and said inner zone and having the second conductivity type, said floating layer having a doping concentration at least a factor of 10 smaller than a doping concentration in said at least one base zone.

11. The field-effect-controllable semiconductor component according to claim 1, wherein said at least one intermediate cell zone has a width laterally of 1 to 2 $\mu$m.

12. The field-effect-controllable semiconductor component according to claim 1, wherein said at least one trench projects approximately 1 to 5 $\mu$m from said first surface into said semiconductor body.

13. The field-effect-controllable semiconductor component according to claim 1, wherein said at least one trench has a width laterally of approximately 1 $\mu$m.

14. The field-effect-controllable semiconductor component according to claim 1, wherein said at least one trench is spaced from said at least one base zone by 5 to 20 $\mu$m.

* * * * *